United States Patent
Hathaway et al.

[11] Patent Number: 5,835,876
[45] Date of Patent: Nov. 10, 1998

[54] TORQUE CONVERTER CLUTCH SOLENOID FUNCTIONAL TEST

[75] Inventors: Richard Reynolds Hathaway, Canton; Kenneth Paul Wozniak, Chelsea, both of Mich.

[73] Assignee: Ford Global Technologies, Inc., Dearborn, Mich.

[21] Appl. No.: 699,741

[22] Filed: Aug. 20, 1996

[51] Int. Cl.⁶ .................................................. G01M 15/00
[52] U.S. Cl. ........................... 701/62; 701/67; 73/118.1; 477/65; 477/169
[58] Field of Search ................................ 701/62, 67, 29; 73/118.1; 477/65, 169, 174

[56] References Cited

U.S. PATENT DOCUMENTS

| | | | |
|---|---|---|---|
| 4,386,521 | 6/1983 | Hamada et al. | 73/118.1 |
| 4,805,750 | 2/1989 | Nitz | 192/3.58 |
| 4,843,551 | 6/1989 | Milunas | 701/55 |
| 5,027,647 | 7/1991 | Shimanaka | 73/118.1 |
| 5,029,087 | 7/1991 | Cowan et al. | 701/68 |
| 5,046,175 | 9/1991 | Lentz et al. | 701/62 |
| 5,174,137 | 12/1992 | Kato et al. | 73/118.1 |
| 5,233,890 | 8/1993 | Aldrich, III et al. | 477/65 |
| 5,323,320 | 6/1994 | Hathaway et al. | 701/67 |
| 5,345,817 | 9/1994 | Grenn et al. | 73/117.3 |
| 5,383,825 | 1/1995 | El-Khoury et al. | 477/149 |
| 5,389,046 | 2/1995 | Timte et al. | 475/127 |
| 5,413,539 | 5/1995 | Leonard et al. | 475/63 |
| 5,445,016 | 8/1995 | Neigebauer | 73/118.1 |
| 5,484,353 | 1/1996 | Lux et al. | 477/169 |
| 5,484,354 | 1/1996 | Vukovich et al. | 477/174 |
| 5,515,272 | 5/1996 | Sakai et al. | 701/29 |
| 5,521,818 | 5/1996 | Palansky et al. | 701/62 |
| 5,609,550 | 3/1997 | Saxena et al. | 477/166 |

FOREIGN PATENT DOCUMENTS

| | | |
|---|---|---|
| 52-22201 | 2/1977 | Japan . |
| 3-77045 | 2/1991 | Japan . |

*Primary Examiner*—Tan Q. Nguyen
*Attorney, Agent, or Firm*—James J. Dottavio

[57] ABSTRACT

A method and system for testing the functionality of a solenoid used to change the apply state of a torque converter clutch in a vehicle having an electronic control unit and a driveline system including an engine, a transmission, a torque converter. A first torque converter speed ratio is established. The commanded apply state of the torque converter clutch is determined, then a second torque converter speed ratio is calculated using engine speed and output shaft speed. The functionality of the torque converter clutch solenoid is established by determining whether the torque converter clutch solenoid has changed the applied state of the torque converter clutch by performing a comparison of the first and second torque converter speed ratios.

25 Claims, 7 Drawing Sheets

ND5,835,876

TORQUE CONVERTER CLUTCH SOLENOID FUNCTIONAL TEST

FIELD OF THE INVENTION

The present invention relates to a functionality test for a vehicular torque converter clutch solenoid.

DESCRIPTION OF THE PRIOR ART

A torque converter couples the engine to the transmission and operates to transfer engine torque to the transmission, which in turn transfers torque to the wheels. More specifically, the torque converter, which includes a clutch, operates to increase torque while reducing engine speed. Torque converters provide well-known advantages due to the infinitely variable conversion of speed and torque. Operation, or application, of the torque converter clutch is typically controlled by a solenoid.

The California Air Resources Board On-Board Diagnostics, more commonly known simply as OBD-II, is a set of regulations which prescribe certain standards relating to vehicular emissions. Currently, these regulations require that if the torque converter clutch is inadvertently applied as a result of a purely electronic component failure, then the MIL must be illuminated.

Existing strategies for testing the torque converter clutch control system only perform electrical "presence" tests. However, according to the OBD-II requirements, a purely electrical "presence" test of the torque converter clutch control system is not sufficient to eliminate the electronics as a contributor.

It would be desirable, therefore, to devise a torque converter clutch functional test which distinguishes between OBD-II electronic component (e.g. solenoids) failures and other, non-OBD-II subsystem failures (e.g. mechanical, hydraulic, and the like). Although a failed torque converter clutch solenoid (an electronic component failure) and a stuck clutch control valve (a mechanical failure) could both cause the torque converter to lockup when a lockup has not been requested by the powertrain control module, only the former requires illumination of the MIL under the regulations.

Prior efforts to determine the status of the torque converter bypass clutch involve measuring engine speed and torque converter turbine speed to compare the input speed of the torque converter to the speed of the torque converter, thereby determining whether the bypass clutch is applied. Known means to measure the turbine speed require the use of a turbine speed sensor, which the present invention seeks to do without.

It would therefore be desirable to provide a means to test the torque converter clutch solenoid without using a turbine speed sensor while reducing the error of slippage other than the torque converter clutch slippage.

SUMMARY OF THE INVENTION

It is, therefore, an object of the present invention to provide an improved torque converter clutch solenoid functional test.

It is a further object of the present invention to provide a torque converter clutch solenoid functional test which distinguishes between electronic component failures and other subsystem failures, such as mechanical and hydraulic failures, without using a turbine speed sensor.

In carrying out the above objects and other objects and features of the present invention, a method and system are provided for testing the functionality of a torque converter clutch solenoid. The method and system are for use with a vehicle having an electronic control unit and a driveline system including an engine, a transmission, a torque converter, and a torque converter bypass clutch for controlling operation of the torque converter, and a solenoid for use with the torque converter clutch.

The functionality of the solenoid is tested by determining the commanded apply state of the torque converter clutch, calculating a first torque converter speed ratio using engine speed and output shaft speed, and monitoring the torque converter speed ratio to determine the functional state of the solenoid.

The torque converter clutch solenoid functional test methodology of the present invention distinguishes between electronic component failures and other subsystem failures, while not requiring the use of a turbine speed sensor. The above objects and other objects and features of the invention will be readily appreciated by one of ordinary skill in the art from the following detailed description of the best mode for carrying out the invention when taken in connection with the following drawings.

DESCRIPTION OF THE PREFERRED EMBODIMENTS

Figure 1:
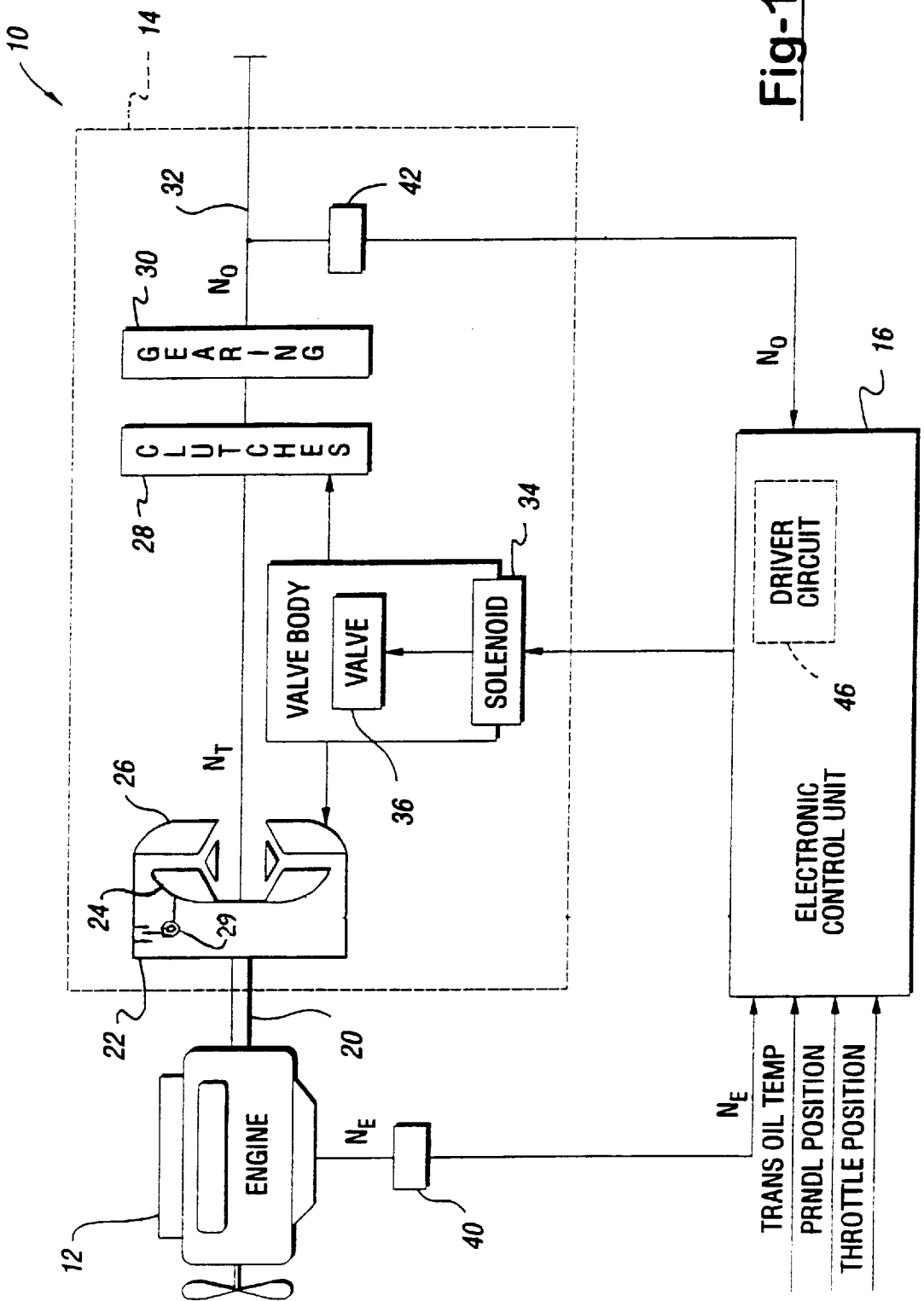
FIG. 1 is a block diagram of a system for use with the present invention.

Referring now to FIG. 1, there is shown a block diagram of a system 10 for use with the present invention. As illustrated, the system includes an internal combustion engine 12, a transmission 14 and an electronic control unit (ECU) 16. The transmission 14 transmits the torque generated by the engine through the transmission to drive axles not specifically illustrated. The torque flow originates at the engine output shaft 20 and flows through a torque converter 22, at least one clutch shown generally by reference numeral 28, and gearing shown generally by reference numeral 30, to the transmission output shaft 32, which is mechanically coupled to the drive axle.

It should be appreciated that the ECU 16 includes a microprocessor and memory, such as RAM, KAM, and ROM memories, not specifically illustrated for the sake of clarity. It should be understood that in the preferred embodiment, this ECU 16 is a powertrain control module which cooperates with other control units for performing vehicle control, although the control unit 16 could, of course, be a master vehicle control unit. The control units are encoded with computer readable code. As is known in the art, the ECU includes a computer chip onto which the method described herein is programmed. Alternatively, one skilled in the art recognizes the method described herein could be programmed into diagnostic software included on a programmable computer chip remote from the ECU, a computer disk, or any other known computer storage media.

With continuing reference to FIG. 1, the impeller 26 of the torque converter 22 is rotatably driven by the output shaft 20. The turbine 24 of the torque converter is rotatably driven by the impeller 26 by means of a known fluid transfer between the turbine and the impeller. In turn, the turbine 24 rotatably drives the transmission input shaft. Each clutch 28 is a fluid-operated, load carrying friction element which can be applied or released according to a transmission operating strategy for establishing different ratios of the gearing 30 and for establishing torque flow paths through the gearing.

In the preferred embodiment, the ECU 16 executes the strategy based on a plurality of operating parameters, such as transmission oil temperature, shift lever position and throttle position, to name a few. Sensors, such as speed sensors 40 and 42 provide engine speed ($N_E$) and vehicle speed (VS) or transmission output shaft ($N_O$) speed information,—respectively, to the ECU 16. The ECU utilizes these vehicle operating parameters to determine a control signal which is utilized by standard driver circuitry 46 to obtain an electric current for energizing a torque converter clutch (TCC) solenoid shown generally by reference numeral 34. The solenoid could be, for example, a variable force solenoid (VFS) energized according to a percent (%) current control signal, or a pulse-width modulated solenoid energized according to a duty cycle control signal. The TCC solenoid 34 controls a bypass clutch control (BCC) valve 36 which is utilized to apply the torque converter clutch 29.

Figure 2:
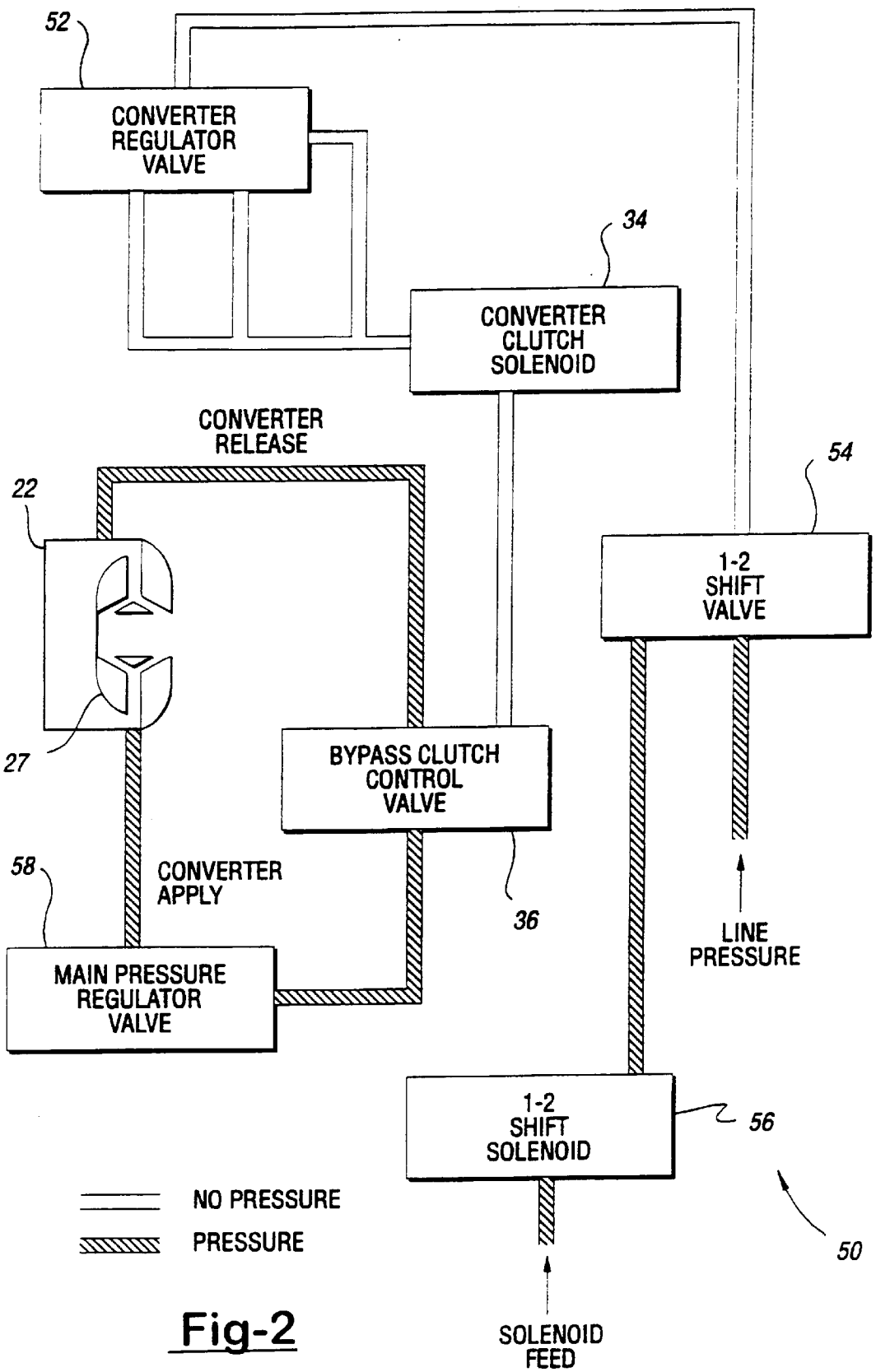
FIG. 2 is a torque converter clutch hydraulic apply circuit for use with the present invention.

Referring now to FIG. 2, there is shown a torque converter clutch apply circuit, shown generally by reference numeral 50, for use with the system shown in FIG. 1. In the preferred embodiment, the torque converter clutch solenoid functional test utilizes the hydraulic design of the apply circuit 50. As shown, the apply circuit 50 includes a converter regulator valve 52 in fluid communication with the TCC solenoid 34 (FIG. 1) and a 1–2 shift valve 54. The 1–2 shift valve 54 receives hydraulic fluid at line pressure, and also from a normally open 1–2 shift solenoid 56.

The TCC solenoid 34 is in fluid communication with the BCC valve 36, which in turn is in fluid communication with the torque converter 22 and a main pressure regulator valve 58. The TCC solenoid 34 controls the position of the bypass clutch control valve. As described in U.S. Pat. No. 5,445,016, assigned to the assignee of the present invention, which is incorporated herein by reference (the '016 patent), in first gear, no pressure is supplied to the converter regulator valve 52 and solenoid 34 via the 1–2 shift valve 54 in a preferred embodiment. As such, even if the converter solenoid is energized, no hydraulic fluid is provided to the bypass clutch control valve 36 and hence no lockup is possible. The BCC valve, in its normal first gear state, allows pressure to be fed to the release side of the torque converter 22, keeping the converter unlocked in first. If the BCC valve 36 is stuck in the wrong position, however, release pressure is cut-off and the converter 22 will apply (apply pressure is always fed to the converter).

Thus, in a preferred embodiment, the application of the converter clutch 29 is hydraulically inhibited while the transmission 14 is in first gear, by use of the BCC valve 36. In such an embodiment, the torque converter clutch can not be applied in first gear, even if a 100% duty cycle is output to the solenoid 34. However, alternative transmission designs enable the use of the TCC in first gear. In such an alternative embodiment, the TCC may similarly be tested upon being commanded "off" as described below in the special unlock test.

The test logic continuously monitors the state of the torque converter clutch 29. If the converter clutch is applied in first gear, then a hydraulic malfunction (e.g. bypass clutch control valve stuck on) exists in a preferred embodiment. Similarly, if the converter clutch is applied in every forward gear, then the bypass clutch control valve 36 is in an incorrect position (e.g. stuck on), and the state of the TCC solenoid 34 can not accurately be determined. If the converter clutch is not applied in first gear, but is applied in all remaining gears, then the solenoid 34 may be the cause. Thus, if the converter clutch is applied in a gear other than first, the cause could be either a hydraulic malfunction, or a malfunctioning torque converter clutch solenoid. A preferred embodiment of the present invention can distinguish between these types of faults.

Referring now to FIGS. 3A–3E, there is shown a flowchart detailing the torque converter clutch solenoid functional test according to the present invention. Generally, the test logic determines if the TCC solenoid is mechanically "off", although commanded "on" (i.e. duty cycle output by the electronic control unit to the TCC solenoid is non-zero). Alternatively, the test may also determine whether the TCC solenoid is mechanically "on", although commanded "off" (i.e. duty cycle output by the electronic control unit to the TCC solenoid is zero).

If the duty cycle to the TCC solenoid changes from zero to non-zero, or vice-versa, then the ECU is requesting the TCC to change state, and the functional test logic described is enabled. As noted above, the TCC functional test logic takes advantage of the hydraulic design of the transmission.

The functional test logic continuously monitors the apply state of the converter clutch. "On" counters and "off" counters are used to verify whether the apply state of the TCC is applied ("on") or non-applied ("off"). When the value of one of the counters exceeds a calibratible threshold, the apply state of the converter clutch is verified. Both counters are zeroed and not allowed to update for a calibratible time through the use of a delay timer if a transient disturbance in the driveline is detected, so as to increase the accuracy of the test results.

Determination of the apply state of the TCC is accomplished by comparing the actual torque converter clutch slip with a calculated open converter clutch slip value, as described in greater detail below. In a preferred embodiment, if the TCC is applied in first gear, the BCC valve is then determined to be stuck in an "on" position, as the TCC of the preferred embodiment is not applied while the transmission is in first gear. The strategy implements "on" and "off" counters which are used to verify the position of the valve—one is incremented if the converter clutch is applied in first gear while the other counter is decremented. The reverse happens if the TCC is not applied in first gear. If the one BCC valve counter exceeds a calibratible threshold, then the BCC valve is verified as stuck in the "on" position, whereas if the other BCC valve counter exceeds a calibratible threshold, the BCC valve is determined to be in its correct position for first gear, and is assumed to be functioning properly. In a preferred embodiment, the counters are only allowed to update once when first gear is commanded. It follows that unless first gear is commanded a calibratible amount of times, the counters will be unable to reach a threshold.

Once the position of the BCC valve is determined, this information is then used to determine the functional state of the TCC solenoid. In a preferred embodiment, no determination is made regarding the mechanical state of the TCC solenoid until the state of the BCC valve has been verified. If the BCC valve is determined to be stuck in the "on" position, the converter clutch will always be applied, regardless of the state of the TCC solenoid. Thus, the test logic is preferably disabled until the next ECU power-up.

In a preferred embodiment, if the BCC valve was previously verified to be "off", and the TCC is applied in a forward gear when the TCC has not been commanded "on" by the ECU, then the TCC solenoid is said to be mechanically failed "on". Again, counters are preferably used to verify the TCC mechanical state. If the TCC is applied under these conditions, a counter is incremented. The reverse happens if the TCC is not applied under these conditions. When the value of one of the counters exceeds a calibratible threshold, the apply state of the converter clutch is verified. In a preferred embodiment, the counters are only allowed to update once when a zero TCC solenoid state is reached. Thus, unless a zero duty cycle is commanded a calibratible amount of times, the counters will be unable to exceed a threshold. If the TCC is determined to be mechanically failed "on", an appropriate malfunction code is set.

When testing whether the TCC is "off", the actual TCC slip (SLIP_ACT) is compared with a model open converter slip value (SLIP_OPEN1), as described in the '016 patent. If the actual slip is considerably less than the model (a calibratible parameter), the TCC is being applied and is stuck "on" when commanded "off". However, the present invention does not utilize a turbine speed sensor, so $NT_F$, unlike the '016 patent, is obtained from the output shaft speed as described below, wherein the vehicle speed is utilized to calculate turbine speed. When testing whether the TCC is "on", the test compares the calculated torque converter speed ratio (SPD_RATIO) to a stored speed ratio to determine if the clutch is slipping.

The stored speed ratio is preferably established when a change in state of the TCC is commanded, or just prior thereto, using the method described herein. Alternatively, the speed ratio may be stored from a prior test or approximated until a ratio is determined using known vehicle parameters until N/V is learned. The speed ratio may also be established during one of the tests described below.

The calculated speed ratio equals the calculated Torque Converter Speed ($N_t$) divided by the sensed Engine Speed ($N_e$). $N_t$ is calculated by multiplying the output shaft speed ($N_o$) times the transmission gear ratio. The gear ratio is inferred from the selected gear. $N_o$ is preferably calculated by multiplying the sensed vehicle speed (VS) times a relationship between the output shaft speed and the vehicle speed (N/V), which is preferably learned when the TCC is applied as described above. In an alternative embodiment, the output shaft speed is measured directly. When the TCC is applied, N/V is stored in KAM until the TCC test described below is run. Sources of error in the above measurements include a TCC error, a transmission ratio error or transmission clutch slippage, or the N/V stored in KAM does not equal actual N/V. The TCC error is isolated using the following test. The vehicle speed is influenced by the engine speed; torque converter, transmission or other driveline slippage; gear ratio selected in the transmission; axle ratio; tire size; and whether a low range is selected, for example in a 4×4 system.

Figure 3A:
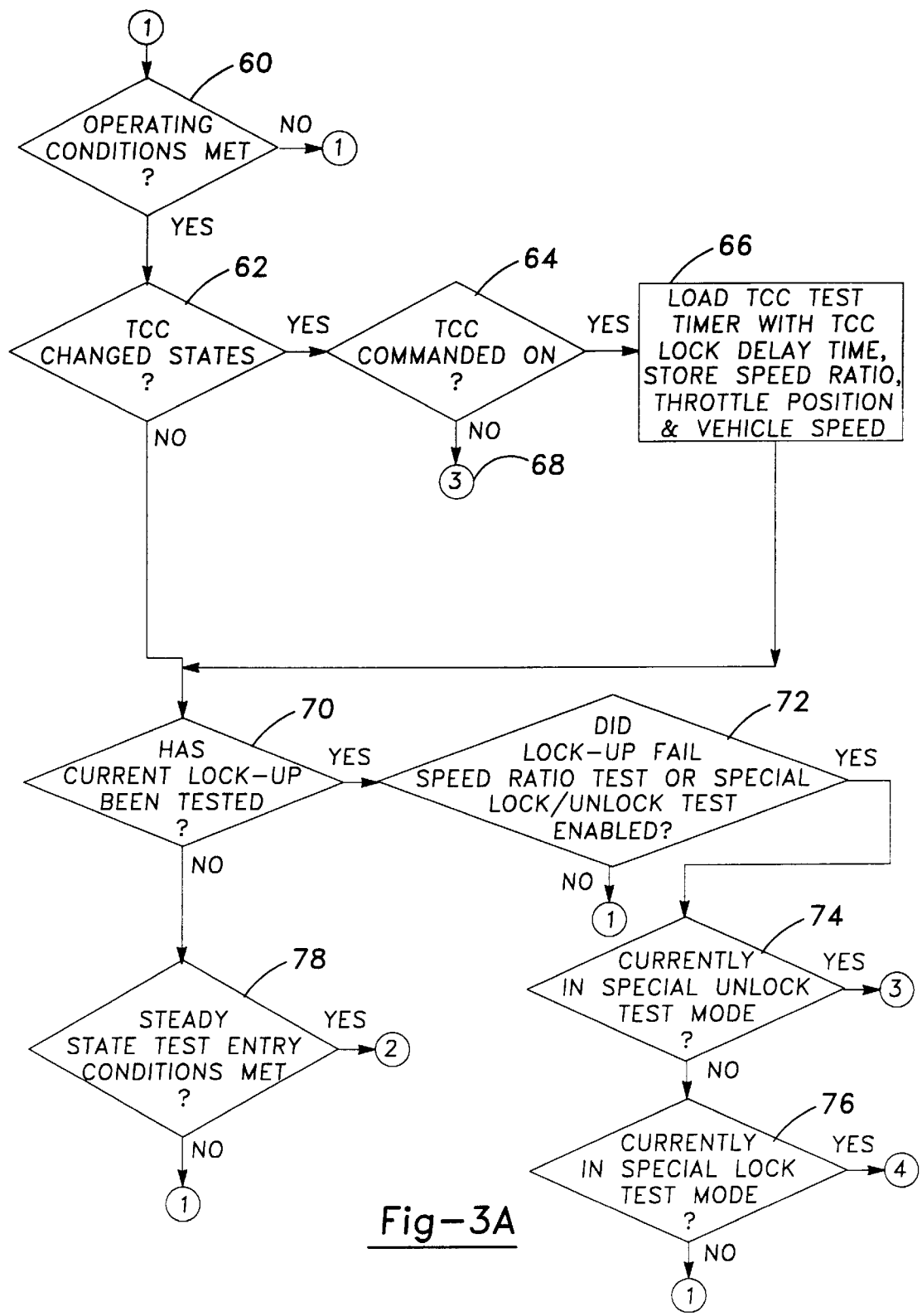
FIGS. 3A–3E is a flowchart detailing the torque converter clutch solenoid functional test of the present invention.

As shown in FIG. 3A, at step 60, the ECU 16 determines whether or not the torque converter operating conditions have been met. If the operating conditions are not satisfied, the functional test is disabled and the associated software module is exited. In a preferred embodiment, the operating conditions include the transmission output shaft speed being above a speed threshold, and the speed ratio across the torque converter being within a pair of speed ratio thresholds. Similarly, the test may be disabled if the relative throttle position is not within specified limits, or if the change in throttle requested is unacceptable. The functional test is preferably disabled if the instant transmission oil temperature measurements is not within a calibratible range or the average temperature is not acceptable over a calibratible amount of time. Additionally, the test is preferably disabled if the net torque into the torque converter is not within specified limits, or if the change in net torque into the torque converter exceeds a calibratible limit.

If the operating conditions are satisfied, control flow proceeds to step 62, wherein the ECU 16 determines the state of a transmission gear register, the value of which indicates whether or not the transmission is in first gear. If the transmission is in first gear, the value of the register is set to "1". The register is a RAM register which can take on values of "1", "2", "3" or "4", etc. corresponding to first, second, third, or fourth, etc. gear, respectively. The ECU further determines whether the TCC solenoid has been commanded "on" or "off", thereby changing the state of the TCC, and the test proceeds to check the present state of the TCC at step 64. If the TCC is commanded "on", the TCC test timer is loaded with the lock-up delay time and the gear ratio is stored, step 66. If the TCC is commanded "off", preferably the special unlock test is enabled and the test proceeds at step 68. Alternatively, an unlock is not tested and the test is exited back to step 1 until a TCC lock-up is commanded.

The test proceeds to check whether the current lock-up state has been tested, step 70. If the current lock-up has not been tested, the test determines whether the steady state (SS) entry conditions are met, step 78, preferably including: whether the TCC is commanded on; the engine speed/vehicle speed ratio (N/V) has been learned or the TCC has not been monitored; and a calibrated number of tests have not been run (i.e. if an error from a source other than the TCC exists, such as a transmission ratio error, then the test is disabled once the TCC is determined "good" to prevent the TCC from cycling). If the SS test entry conditions are not met, then the test returns to the first step.

Figure 3B:
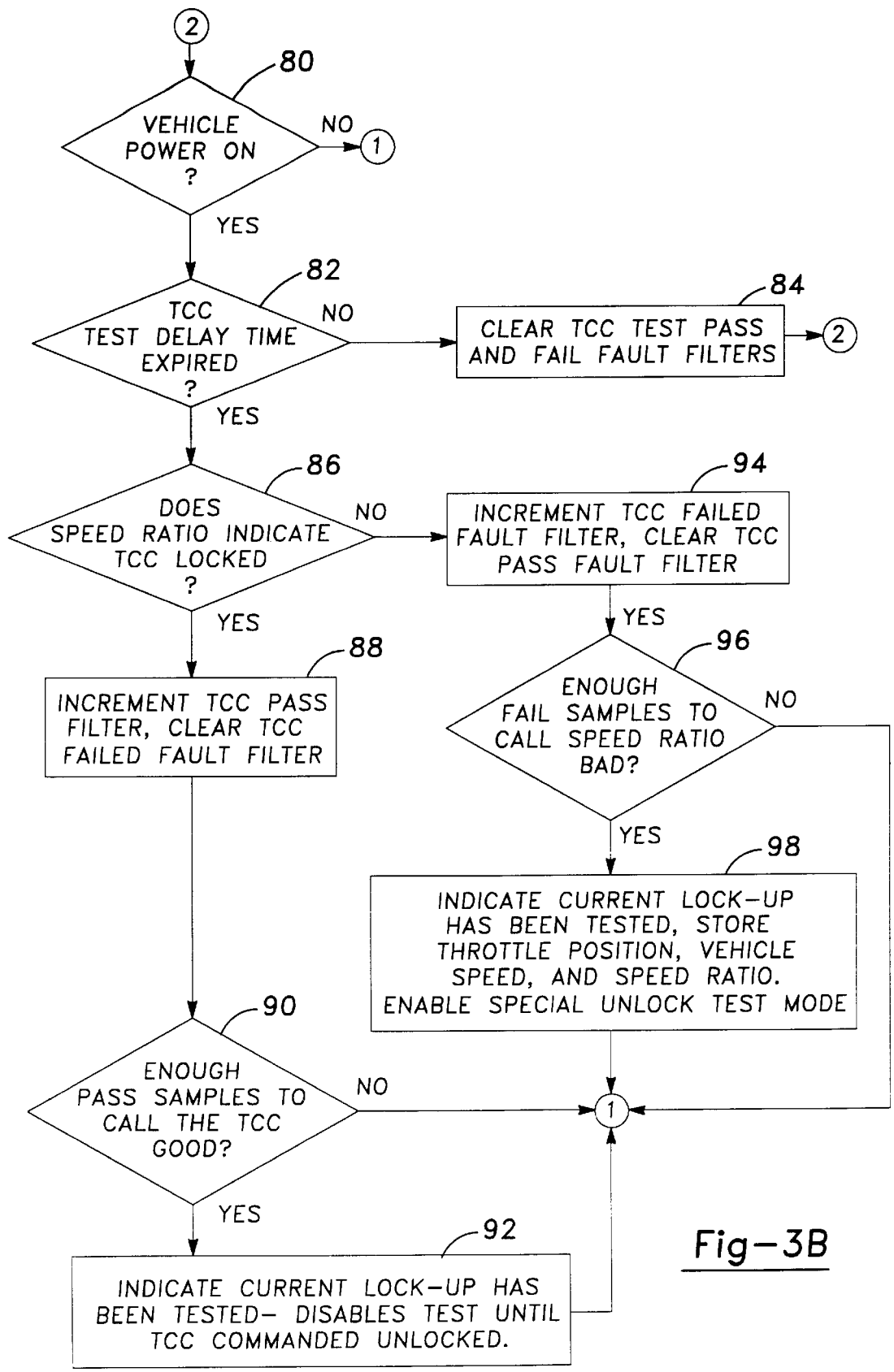

Once the SS test entry conditions are met, the SS test is run. Referring to FIG. 3B, it is first established that the vehicle power is on, step 80. This includes a determination that the power flow is from the engine to the driven wheels; i.e. the engine is running and the transmission is in gear. If not, the test returns to the first step in FIG. 3A. If the power is on, the test determines whether the TCC delay test time has expired to ensure the TCC should be applied (not slipping), step 82. If the time has not expired, the test returns to step 80 after the TCC test pass and fail fault filters are cleared, step 84, thereby allowing enough time to expire, ensuring the clutch should be engaged. Once the timer expires, the test checks the speed ratio to see if the output speed indicates slippage over the TCC and transmission, step 86. The calculated speed ratio is then compared to the stored speed ratio to see if the values agree within a calibratible limit.

If the test fails at this point, step 86, it is not known whether the error is due to slippage over the TCC or a gear ratio error, or whether the N/V ratio stored in keep alive memory (KAM) fails to match the actual vehicle N/V. The TCC "on" test is preferably run before the N/V is learned, because the N/V ratio is more accurate when the TCC is functional. Third and higher gear N/V are then learned and must nearly match the update KAM. If the N/V has not been learned and the measured speed ratio is below the calibratible minimum, the unlock and relock tests are run as described below. If the test is passed, the TCC test is disabled until N/V is learned for the current power up, otherwise the TCC would continue cycling as it would be tested repeatedly.

If N/V is learned and the speed ratio is tested as being correct, the TCC pass fault filter is incremented and the TCC fail fault filter is cleared, step 88. The test then determines whether a calibratible number of tests have been passed, step 90. If enough tests have been passed, the test indicates the lockup is good and the test is disabled until an unlock is commanded, step 92. If an inadequate number of samples have been tested, the test is run again.

If the speed ratio indicates the TCC is not locked-up when commanded "on", step 86, the TCC failed fault filter is incremented and the TCC pass fault filter is cleared, step 94. The test then determines whether a calibratible number of tests have been failed, step 96. If enough tests have been failed, the test indicates the lockup is bad, and the throttle position, vehicle speed and speed ratio are stored. The special unlock test mode is enabled and the failure of the current lockup is stored, step 98. If an inadequate number of samples have been tested, the test is run again, step 96.

Referring back to FIG. 3A, if the current lockup state has been tested, step 70, it is then determined if the speed ratio test has been failed, or if the TCC special lock test or TCC special unlock test are presently enabled, step 72. If none of these conditions are met, then the test returns to the first step. Otherwise, the test proceeds to the special unlock test, step 74, or the special lock test, step 76, as enabled.

Figure 3C:
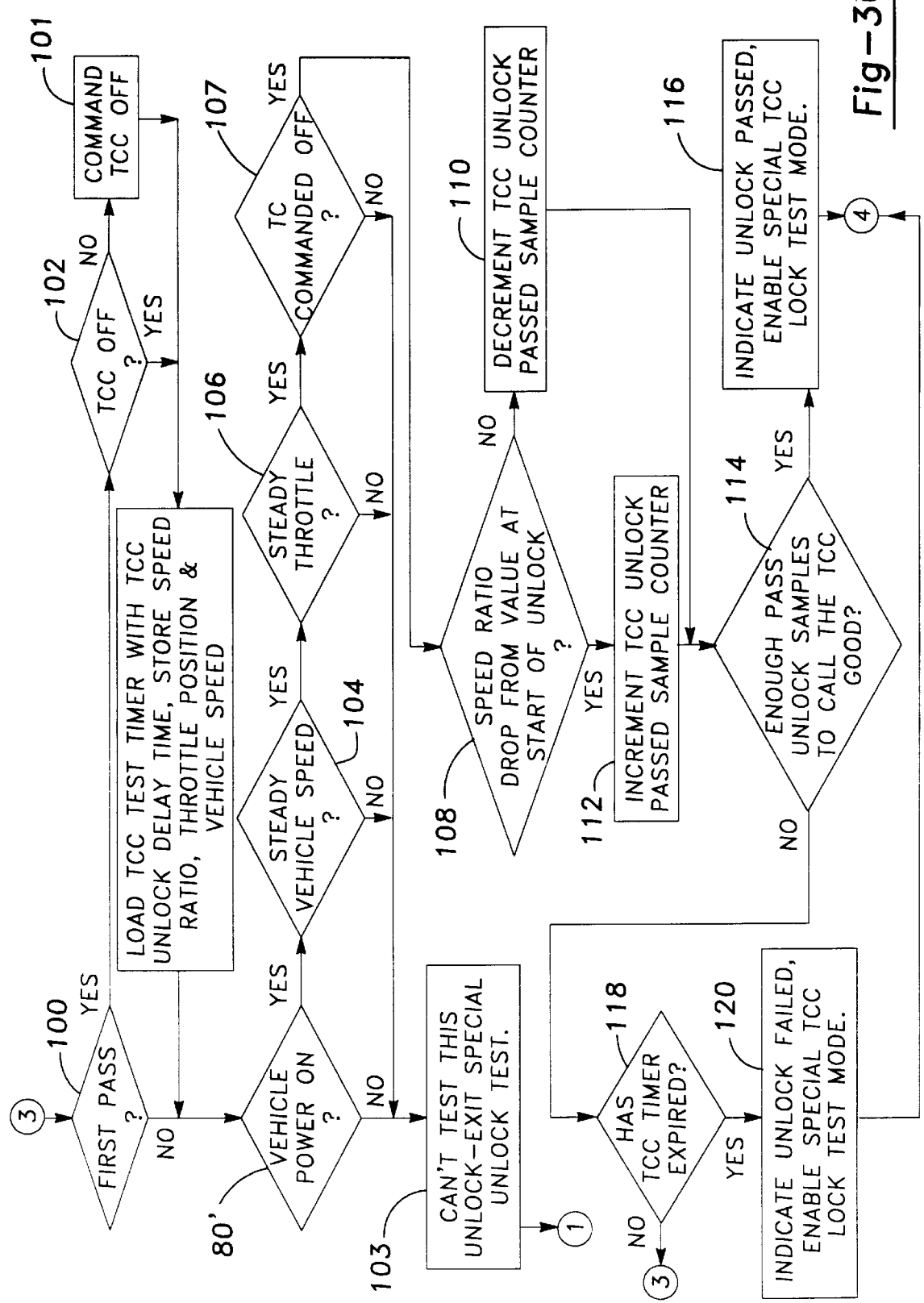

Referring now to FIG. 3C, the TCC special unlock test is shown. The special unlock test includes entry tests which include a determination if this is the first pass through the special unlock test, step 100. If not, the test is proceeding, step 118. On the first pass through the test, a counter is checked to determine whether an unlock was commanded, step 102. If an unlock was commanded, the test proceeds, step 80', otherwise an unlock is commanded, step 101 and the test proceeds. The special unlock test further includes a determination that the vehicle power is on, step 80', as described in step 80 above. If not, the special unlock test is exited, step 103. Likewise, if the vehicle is not at steady speed and steady throttle, steps 104 and 106, the special unlock test is exited, step 103. If during the special unlock test the TCC is commanded "on", the test is exited, steps 107, 103.

If the special unlock test entry conditions are met, the test determines at step 108 whether the speed ratio has dropped from the value at the start of the commanded unlock. If the speed ratio has not dropped, the TCC unlock passed counter is decremented, step 110. If the speed ratio has dropped, the TCC unlock counter is incremented, step 112. The test then determines whether enough samples have passed to establish that the TCC has actually changed state from locked to unlocked, step 114. If an adequate number of samples are collected calling the unlock "passed", it is indicated the unlock test passed and the TCC special lock test is enabled, step 116. If an inadequate number of "TCC unlocked passed" samples have been collected, the TCC unlock timer is evaluated. If the timer has expired, the unlock is called "bad" and the TCC lock test mode is enabled, step 120. If the timer has not expired, further samples are taken, step 118.

The special unlock test may compare the measured speed ratio after a calibratible amount of time has passed to the speed ratio at the beginning of the unlock as described above. If the solenoid in the steady state failed in the "off" position, then no drop in speed ratio would be noted, as the TCC was not applied in the first place. Thus the unlock test would be failed. Alternatively, the special unlock test could compare the speed ratio to a stored speed ratio calculated when the solenoid was verified or an estimated ratio. In this alternative, the measured and stored speed ratios should substantially agree for the test to pass.

In a further alternative, the special unlock test may be run in the first instance when the TCC is commanded "off" (i.e. a steady state unlock test). In such a test, a drop in the speed ratio would be noted between the time the TCC was commanded "off" to the time the later measurement was taken if the solenoid is functioning properly (similar to the TCC special unlock test after the steady state test is run).

Figure 3D:
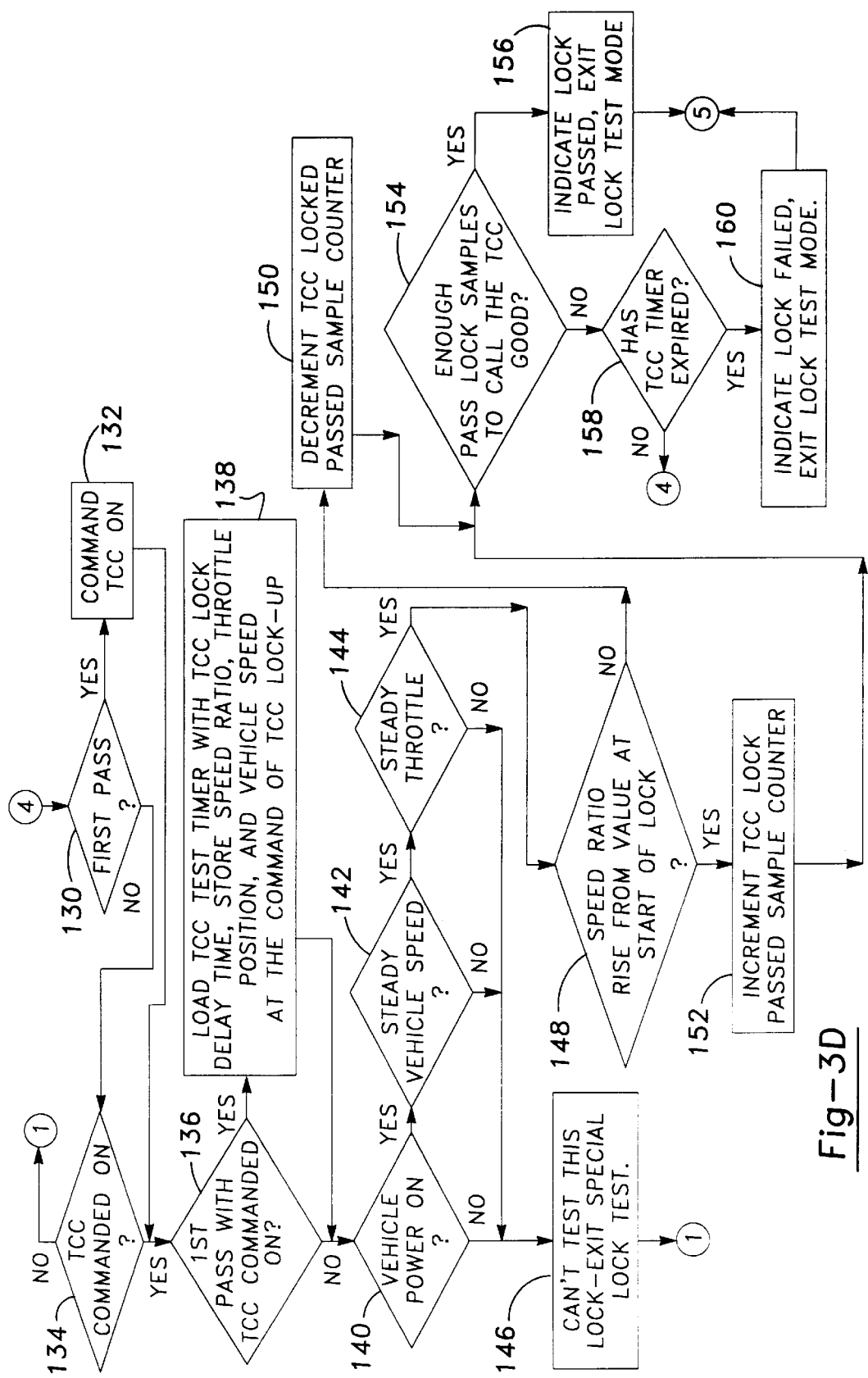

Referring now to FIG. 3D, the TCC special lock test mode is shown. First, it is determined whether this is the first pass through the TCC special lock test mode for this instance, step 130. If so, the TCC is commanded on, step 132. In any pass, it is determined whether the TCC is commanded on, step 134, in case an unlock was commanded during testing. During the first pass only, the speed ratio, throttle position, and vehicle speed at the TCC "on" command are stored, step 138. It is then determined whether the vehicle power is on as described above, whether the vehicle is traveling at a steady speed, and whether the throttle is steadily applied, steps 140, 142 and 144.

If the TCC special lock test conditions are not met, the test is preferably exited, step 146. If the conditions are met, it is determined whether the speed ratio has risen from the command to apply the TCC, indicating a lock-up, step 148. The TCC locked counter is then incremented or decremented accordingly, steps 150, 152. The test then determines whether enough samples have been collected to call the lock good, step 154. If so, the test indicates the TCC lock is good and proceeds to the Test Complete Logic, step 156. If an inadequate number of samples have passed, the TCC test timer is evaluated, step 158. If the timer has expired, the lock is called bad and the Test Complete Logic is entered, step 160. If the timer has not expired, more samples are collected in the Special TCC lock test mode.

Alternatively, the TCC special lock test may not be required if, when the TCC is commanded "on", the steady state test results are compared with the TCC special unlock test results (i.e. if the TCC failed the steady state test upon lockup, then it should fail the special lock test as well).

Similar to that discussed above for the special unlock test, if the special lock test utilizes a test for the change in speed ratio from the time the lockup is commanded, the test would fail a solenoid stuck "on", as the TCC would not change state upon being commanded "on" and the speed ratio would therefore not change. In such an instance, a speed ratio could have been stored when the solenoid was verified, or an estimated speed ratio could be stored which will enable the test to determine the solenoid is stuck "on".

Figure 3E:
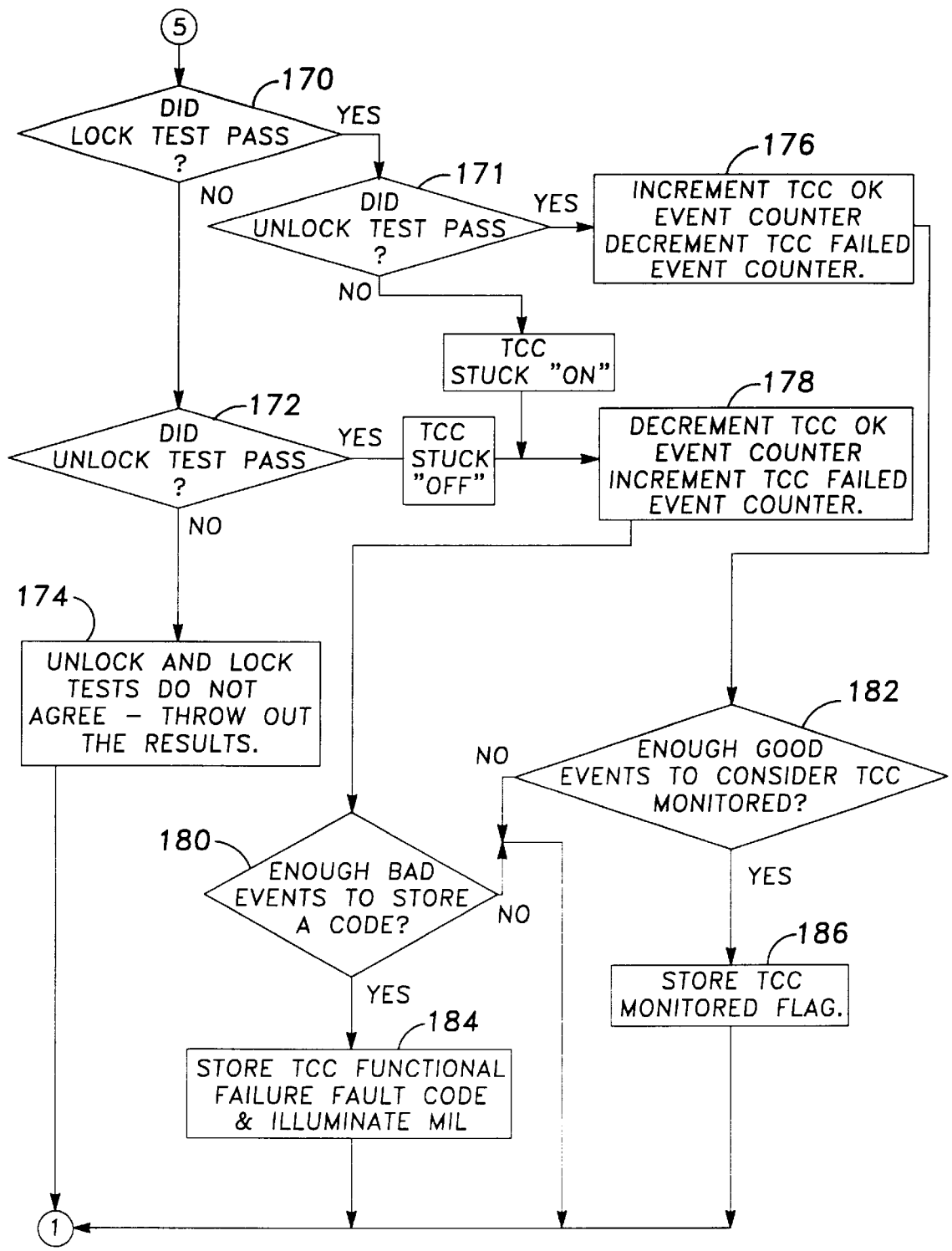

In FIG. 3E, the Test Complete Logic (TCL) is shown. This test analyzes the results of the special unlock and lock tests. The TCL compares the results to see if both tests agree, showing both tests passed or failed, steps 170, 171, 172. If both tests fail, the results may be thrown out, step 174, as the results may be inconsistent (i.e. the TCC is stuck "on" and stuck "off"), if the test was not looking for the change in speed ratio. However, if the test observes a change in speed ratio, then both tests may be failed in such an instance, as the speed ratio will not change because the solenoid is stuck. If both tests pass, the TCC passed counter is incremented, step 176. If one special test passed and one failed, the TCC failed counter is incremented, step 178, depending again on whether the test was observing a change in speed ratio or testing against a verified or estimated speed ratio as described above. The Test Complete Logic then determines whether a calibratible number of tests have passed or failed, steps 180, 182.

Alternatively, as discussed above, one of the special lock/unlock tests may make the determination that a test is failed because no change in speed ratio occurs from the time the TCC is commanded "on" or "off" (because the TCC is already stuck in that state). In such an instance, that test will be failed and it would be expected that the other test would fail as well because no change in speed ratio would occur. One skilled in the art recognizes these permutations are programmed into the TCL to account for the logic chosen for the tests. Furthermore, the TCL may use a combination of tests wherein the change in speed ratio is used to determine if a test is failed. Upon determination of such a failure (i.e. no change is speed ratio upon commanding a lockup or unlock), the test could then use a stored or estimated speed ratio to determine whether the TCC is stuck "on" or "off" at that time.

If enough tests have failed, the TCC failed fault code is stored and the MIL is illuminated, step 184. If enough have passed, a TCC monitored flag is stored, step 186. If the test is passed or failed, the test returns to the beginning of the TCC solenoid functional test. If the results are thrown out, the special lock and unlock tests are preferably repeated.

In a preferred embodiment, when the entry conditions are met, every time the TCC is commanded "on" the test is run to determine whether the TCC is slipping and thus whether the TCC solenoid is not functioning. Alternatively, the test may also be run in the special unlock mode each time the TCC is commanded "off" to determine the TCC is not applied.

The test determines whether the torque converter clutch solenoid is functioning properly by monitoring the torque converter speed ratio. Monitoring the speed ratio comprises performing the steady state and/or special test modes as described above and determining whether the speed ratio changes when the TCC is applied or released. In an alternative embodiment, as described above, a previously stored or a theoretical N/V may be used until an N/V is developed as described above.

As also described above, the test calculates a speed ratio, which compares the transmission output speed to the torque converter input speed. Thus when the clutch (or transmission) slips, the speed ratio speed will be less than expected. If the speed ratio is within a calibratible range after a calibratible amount of time, the TCC lock is called "good" and the test is exited until the next change of state of the TCC. If the speed ratio falls below a minimum acceptable calibratible value, the TCC "on" or "off" test is failed and the test enters the "special test mode" to isolate the solenoid from other parameters which affect the speed ratio.

As further described above, the special test modes comprise first storing the steady state speed ratio. Then the TCC solenoid is commanded open or closed to command the TCC "on" or "off", respectively. The speed ratio is monitored for a calibratible amount of time to determine whether the TCC clutch is engaged or disengaged, as described above. The TCC is then commanded "off" or "on" and it is determined whether the clutch is reapplied, as also described above. The special test mode "on" and "off" results are compared, then the status of the TCC is known. If the solenoid is "good", the test is exited until the next event. If the TCC is "bad", the MIL is illuminated. If the test results do not agree, the results are preferably thrown out and preferably the special unlock and special lock tests are again run to determine if the solenoid is functioning properly.

Alternatively, if the vehicle passes a steady state mode test, the special lock or special unlock test mode may be compared to the steady state results to establish the functionality of the TCC solenoid (the steady state test results in such an instance comprise one of the special lock or special unlock tests).

A preferred method for performing the test to determine whether the TCC is in fact slipping is described in further detail in the '016 patent, except for the calculation of the turbine speed, which is performed as described above.

It is understood that while the form of the invention herein shown and described constitutes the preferred embodiment of the invention, it is not intended to illustrate all possible forms thereof. It will also be understood that the words used are words of description rather than limitation, and that various changes may be made without departing from the spirit and scope of the invention as disclosed.

I claim:

1. For use with a vehicle having an electronic control unit and a driveline system including an engine, a transmission, a torque converter operating to transfer engine torque to the transmission, a torque converter clutch having an applied state, and a solenoid to change the commanded apply state of the clutch, a method for testing the functionality of the solenoid comprising:

establishing a first torque converter speed ratio;

determining a commanded apply state of the torque converter clutch;

calculating a second torque converter speed ratio using engine speed and output shaft speed; and determining whether the torque converter clutch solenoid has changed the applied state of the torque converter clutch by performing a first comparison of the first and second torque converter speed ratios.

2. The method for testing the functionality of the torque converter clutch solenoid according to claim 1, wherein comparing the speed ratio when the clutch is commanded applied comprises entering a special unlock test if the second speed ratio does not indicate an increase in speed ratio from the first speed ratio.

3. The method for testing the functionality of the torque converter clutch solenoid according to claim 2, wherein the special unlock test comprises:

commanding the clutch to a not applied state;

calculating a third torque converter speed ratio; and performing a second comparison of the third speed ratio to the first speed ratio.

4. The method for testing the functionality of the torque converter clutch solenoid according to claim 3, wherein the first speed ratio is calculated at the command to change the clutch to the not applied state and the second comparison determines whether the speed ratio has lowered after the torque converter clutch was commanded to the not applied state.

5. The method for testing the functionality of the torque converter clutch solenoid according to claim 3, wherein the first speed ratio is calculated before the command to change the clutch to the not applied state.

6. The method for testing the functionality of the torque converter clutch solenoid according to claim 3, wherein the special unlock test further comprises:

commanding the clutch to the applied state;

calculating a fourth torque converter speed ratio; and performing a third comparison of the fourth speed ratio to the first speed ratio.

7. The method for testing the functionality of the torque converter clutch solenoid according to claim 6, wherein the special unlock test further comprises comparing the results of the second and third speed ratio comparisons.

8. The method for testing the functionality of the torque converter clutch solenoid according to claim 7, wherein the status of the solenoid is determined if the speed ratio comparison establishes that the solenoid passes both the second and third comparisons or establishes the solenoid passes one of the group comprising the second and third comparisons and fails the other of the comparisons.

calculating a third torque converter speed ratio; and performing a second comparison of the third speed ratio to the first speed ratio.

9. The method for testing the functionality of the torque converter clutch solenoid according to claim 1, wherein comparing the speed ratio when the clutch is commanded applied comprises entering a special unlock test if the second speed ratio does not substantially agree with the first speed ratio.

10. The method for testing the functionality of the torque converter clutch solenoid according to claim 1, wherein monitoring the speed ratio when the clutch is commanded not applied comprises entering a special lock test if the second speed ratio does not indicate a decrease in speed ration from the first speed ratio.

11. The method for testing the functionality of the torque converter clutch solenoid according to claim 1, wherein monitoring the speed ratio when the clutch is commanded not applied comprises entering a special lock test if the first speed ratio does not substantially agree with the second speed ratio.

12. The method for testing the functionality of the torque converter clutch solenoid according to claim 11, wherein the special lock test comprises:

commanding the clutch to an applied state;

calculating a third torque converter speed ratio; and performing a second comparison of the third speed ratio to the first speed ratio.

13. The method for testing the functionality of the torque converter clutch solenoid according to claim 12, wherein the first speed ratio is calculated at the command to change the clutch to the applied state and the second comparison determines whether the speed ratio has raised after the torque converter clutch was commanded to the applied state.

14. The method for testing the functionality of the torque converter clutch solenoid according to claim 12, wherein the first speed ratio is calculated before the command to change the clutch to the applied state.

15. The method for testing the functionality of the torque converter clutch solenoid according to claim 12, wherein the special lock test further comprises:

commanding the clutch to the not applied state;

calculating a fourth torque converter speed ratio; and performing a third comparison of the fourth speed ratio to the first speed ratio.

16. The method for testing the functionality of the torque converter clutch solenoid according to claim 15, wherein the status of the solenoid is determined if analyzing the speed ratio comparisons establishes that the solenoid passes both comparisons or establishes the solenoid passes one of the comparisons and fails the other of the comparisons.

17. The method for testing the functionality of the torque converter clutch solenoid according to claim 16, wherein the engine speed and output shaft speed are detected by an engine speed sensor and a vehicle speed sensor, respectively.

18. The method for testing the functionality of the torque converter clutch solenoid according to claim 17, wherein calculating the torque converter speed ratio comprises:

determining a gear ratio of the transmission;

determining an engine speed;

determining output shaft speed based on vehicle speed and a learned constant; and dividing the output shaft speed times the transmission gear ratio by the engine speed.

19. The method for testing the functionality of the torque converter clutch solenoid according to claim 18, wherein the output shaft speed is determined by multiplying the vehicle speed times a learned constant after the torque converter clutch is applied.

20. A computer storage medium for monitoring the functionality of a solenoid used with a vehicle having an electronic control unit and a driveline system including an engine, a transmission, a torque converter operating to transfer engine torque to the transmission, a torque converter clutch having an apply state controlled by the solenoid, the computer storage medium comprising:

speed ratio storage means for storing a first torque converter speed ratio;

apply state means for causing a computer to determine a commanded apply state of the torque converter clutch;

speed ratio calculation means for causing a computer to calculate a second torque converter speed ratio using engine speed and output shaft speed; and functionality test means for causing a computer to determine whether the torque converter clutch solenoid has changed the applied state of the torque converter clutch by performing a first comparison of the first and second torque converter speed ratios.

21. The computer storage medium according to claim 20 further comprising a special unlock test means for comparing the speed ratio when the clutch is commanded applied if the second speed ratio does not indicate an increase in speed ratio from the first speed ratio.

22. The computer storage medium according to claim 20 further comprising a special unlock test means for comparing the speed ratio when the clutch is commanded applied if the second speed ratio does not substantially agree with the first speed ratio.

23. The computer storage medium according to claim 21, wherein the special unlock test means comprises:

clutch command means for causing a computer to command the clutch to a not applied state;

second speed ratio calculation means for causing a computer to calculate a third torque converter speed ratio;

second speed ratio comparison means for causing a computer to compare the third speed ratio to a second stored speed ratio;

second clutch command means for causing a computer to command the clutch to an applied state;

third speed ratio calculation means for causing a computer to calculate a fourth torque converter speed ratio;

third speed ratio comparison means for causing a computer to compare the fourth speed ratio to the first stored speed ratio; and speed ratio analysis means for causing a computer to compare the results of the second and third speed ratio comparisons.

24. In a vehicle having an electronic control unit and a driveline system including an engine, a transmission, a torque converter operating to transfer engine torque to the transmission, a torque converter clutch, and a solenoid to change the commanded apply state of the clutch, a system for testing the functionality of the solenoid comprising:

means for determining the commanded apply state of the torque converter clutch;

means for calculating a first torque converter speed ratio using engine speed and output shaft speed; and means for determining whether the torque converter clutch solenoid has changed the applied state of the torque converter clutch by performing a first comparison of the first and second torque converter speed ratios.

25. The system for testing the functionality of the torque converter clutch solenoid according to claim 24, wherein the means for calculating a first torque converter speed comprises an engine speed sensor and a vehicle speed sensor to determine engine speed and output shaft speed, respectively.

\* \* \* \* \*